(12) United States Patent
Leitgeb et al.

(10) Patent No.: US 6,531,036 B1
(45) Date of Patent: Mar. 11, 2003

(54) FABRICATION OF MICRON-SIZED PARTS FROM CONDUCTIVE MATERIALS BY SILICON ELECTRIC-DISCHARGE MACHINING

(75) Inventors: Rudolf Leitgeb, Mountain View; Jurgen Stampfl, Redwood City; Yih-Lin Cheng, Mountain View; Friedrich Prinz, Woodside, all of CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/383,113

(22) Filed: Aug. 25, 1999

Related U.S. Application Data

(60) Provisional application No. 60/098,393, filed on Aug. 29, 1998.

(51) Int. Cl.⁷ ............................................... H01L 21/00

(52) U.S. Cl. ........................ 204/164; 438/694; 216/11

(58) Field of Search .......................... 438/52, 470, 676, 438/694; 216/2, 11, 25; 64/14; 204/164

(56) References Cited

U.S. PATENT DOCUMENTS 5,546,375 A * 8/1996 Shimada et al. ............ 396/126

OTHER PUBLICATIONS

Takajata, K. et al., *A novel micro electro-discharge machining method using electrodes fabricated by the liga process*, 12$^{th}$ IEEE International Conference, Technical Digest, pp. 238–243, 1999.

* cited by examiner

*Primary Examiner*—Charles Bowers
*Assistant Examiner*—William M. Brewster
(74) *Attorney, Agent, or Firm*—Lumen Intellectual Property Services

(57) ABSTRACT

A method for fabricating sub-millimeter sized parts uses electrodes created from patterned silicon wafers for electric-discharge machining (EDM), in which an electric discharge is generated between a patterned electrode and a conductive workpiece. Workpiece material corresponding to the electrode pattern is removed by electroerosion, and the remaining workpiece contains the desired part. Electrodes are formed by etching stepped patterns in silicon wafers and depositing a thin metallic layer on the wafer. The resulting electrode is used in an EDM machine, and an inverse pattern is produced in the part. Alternately, the silicon wafer pattern is filled by a metal to produce a metal electrode with an inverse pattern. The wafer is removed from the metal, and the metal is used in an EDM machine. The resulting part has the same pattern as the silicon wafer used to create the metal electrode. The metal can be electroplated into the wafer pattern, in which case copper may be used, or metal powder can be hot-pressed into the wafer. Hot pressed electrodes are preferably a mixture of silver and tungsten. The present method is adaptable to highly parallel manufacturing, and can be fully automated using a CAD/CAM system with added process-specific extensions.

17 Claims, 10 Drawing Sheets

Machining Direction

FABRICATION OF MICRON-SIZED PARTS FROM CONDUCTIVE MATERIALS BY SILICON ELECTRIC-DISCHARGE MACHINING

CROSS-REFERENCE TO RELATED APPLICATIONS

This application is based on Provisional application 60/098,393 filed Aug. 29, 1998 which is herein incorporated by reference.

STATEMENT REGARDING FEDERALLY SPONSORED RESEARCH OR DEVELOPMENT

This invention was supported in part by grant number MIP-9618050 from the National Science Foundation (NSF). The U.S. Government has certain rights in the invention.

FIELD OF THE INVENTION

This invention relates generally to micromachining methods. More particularly, it relates to a method for producing sub-millimeter parts by Micro Electric-Discharge Machining using electrodes fabricated by silicon-processing techniques.

BACKGROUND ART

In the past few decades, techniques have been developed for manufacturing sub-millimeter sized parts out of a limited set of materials. Generally, micromachining techniques can produce parts with resolutions of a few micrometers or better. For these techniques to be economically feasible, they must be adaptable to parallel manufacturing, in which many of the same or different parts are produced in one step, and allow a simple transition from a geometric computer-aided design (CAD) model to the physical part.

LIGA (Lithographie, Galvanik, Abformung) is a micromachining technique that creates highly anisotropic patterns in polymeric material by exposing it to monochromatic X-ray radiation through masks. Irradiated regions are easily removed to produce polymer structures with high aspect ratios. Polymer structures are then filled with ceramics or electroplated metals to generate desired microstructures. While LIGA produces high-precision parts, it is limited to part materials that can easily be deposited in the polymer structure. Additionally, electroplating allows no control over the microstructure of the resulting metal part, thereby limiting strength and magnetic properties. Further, the monochromatic X-rays needed are produced in synchrotrons, which are enormously expensive to operate, and of which there is only a handful throughout the world. Patterning a single 3-inch polymer disk takes an entire day. LIGA is a useful research tool but is not feasible for economic mass production.

Silicon and thin film processing can be used to create structures from silicon and compatible materials. Materials are deposited on a silicon support by sputtering or electroplating and shaped by etching. These techniques, while much less expensive than LIGA, also have significant limitations. Not all materials can be deposited in the necessary quality using thin-film techniques. Feature height of sputtered parts is limited by internal stress that causes delamination above 10 $\mu$m. There is also no way to control crystalline structure of the material being deposited, which substantially limits potential applications of the microstructures.

In fact, most existing micromachining techniques are significantly limited in the material that can be machined, and are best suited to producing parts, or sub-parts that can be combined to form an assembled part, with heights below 100 $\mu$m. Conventional machining techniques generally have a minimum part size (height or width) of 1 mm. Parts between 100 $\mu$m and 1 mm, the mesoscale range, are difficult to manufacture using micro or conventional machining techniques.

Electric-Discharge Machining (EDM) is a macroscale technique for fabricating large parts from conductive materials that are too hard to be machined with conventional techniques such as milling or turning. Controlled, short-duration electric discharges are generated between a patterned electrode and a conductive workpiece to remove material by electroerosion. The electrode also wears away during machining, and must be replaced as necessary. Conventional EDM can produce structures or features larger than 1 mm.

EDM has been modified for use in micton-sized applications using different types of electrodes. Wire Electro-Discharge Grinding (WEDG) uses a thin wire electrode. The patterned part is created by moving the workpiece with respect to the wire, thereby "cutting" the workpiece into the correct shape. These and similar processes that use rotating disks as electrodes are described in "Micro Electro-Discharge Machining as a Technology in Micromachining," W. Ehrfeld et al., *Proceedings of the SPIE*, Volume 2879, pp. 332–337 (1996). Because each part must be carefully cut into the desired pattern, and not simply transferred from a patterned electrode as with conventional EDM, existing micro-EDM is a very slow and tedious technique.

A process for using LIGA to create patterned microelectrodes for EDM is described in "A Novel Micro Electro-Discharge Machining Method Using Electrodes Fabricated by the LIGA Process," K. Takahata et al., $12^{th}$ IEEE International Conference on Micro Electro Mechanical Systems, Technical Digest, pp. 238–243 (1999). Because microelectrodes created by LIGA contain the entire part pattern (its inverse, actually), they reduce processing time significantly over wire and rotating disk micro-electrodes. Currently, LIGA electrodes can be produced only by electroplating. Because not all metals can be electroplated easily, only a few electrode materials can be used. For example, tungsten is commonly used as electrode material in WEDG and conventional EDM, because its high melting temperature (3400° C.) provides excellent wear resistance. Tungsten cannot be electroplated easily, and its processing temperature is much higher than polymers can withstand; it is not a viable material for LIGA-produced electrodes. More importantly, LIGA is prohibitively expensive and highly inaccessible, and simply cannot be used for mass production. Because electrodes wear down during the EDM process, new electrodes must be continually made. Electrode fabrication by LIGA cannot be incorporated into an integrated manufacturing system.

There is still a need for an economically viable micro-EDM method that uses a variety of easily-produced patterned electrodes.

OBJECTS AND ADVANTAGES

Accordingly, it is a primary object of the present invention to provide a microfabrication technique for parts made of any type of conductive material, including pure metals, alloys, and magnetic materials.

It is a further object of the invention to provide a technique for fabricating parts of up to 1 mm in height.

It is an additional object of the invention to provide a method that does not alter crystal structure of the part material, preserving macroscopic strength, hardness, and magnetic properties.

It is another object of the present invention to provide a variety of techniques for producing micro-EDM electrodes from a range of materials.

It is another object of the invention to provide a cost-effective micromachining technique that can be used in commercial, mass-production applications.

It is a further object to provide a technique that allows for parallel production methods, and can be used in an integrated CAD/CAM system.

SUMMARY

These objects and advantages are attained by a method of fabricating arbitrarily shaped microstructures from a conductive workpiece by silicon Electric-Discharge Machining (EDM). A small and precise pattern is first created on a silicon wafer, and then the pattern is transferred onto the desired material. The process produces microparts of up to one millimeter in height with a resolution of one micrometer. Crystalline structure of the workpiece is preserved in the fabricated micropart, and the method is suitable for shaping hard and soft magnetic materials, single crystals, and special alloys.

In a first step, a patterned metal or silicon EDM electrode is produced using standard silicon-processing techniques. The pattern contains features with heights preferably between 1 $\mu$m and 1 mm. During the EDM process, an electric discharge is generated between the electrode and a conductive workpiece to remove workpiece material corresponding to the pattern. The remaining workpiece is the micropart. The workpiece can be an amorphous metal, a crystalline metal, a magnetic material, or any other conductive material. The magnetic material may consist of regions of different magnetic orientations, produced by adhering two different materials together. The electrode can then be placed directly over the boundary between the two materials to form the part.

In a first method for creating the electrode, a silicon wafer is etched to produce a surface pattern. A metallic layer is then deposited on the pattern, preferably by sputtering, to a predetermined thickness, such that the metallic layer conforms to the pattern. The silicon wafer with the metallic layer is the EDM electrode; the discharge is generated between the workpiece and the metallic layer. The metallic layer is used to increase the electrical conductivity of the electrode surface. In this method, the pattern on the silicon wafer is an inverse of the micropart pattern.

In a second method, a silicon wafer is again etched to produce a surface pattern. The pattern is completely filled with a metal to create an inverse pattern in the metal. The silicon wafer is then removed from the metal, preferably by chemical etching, and the metal is used as an EDM electrode. For this type of electrode, the pattern on the silicon wafer is the same as the pattern on the micropart, and the electrode pattern is an inverse of both of these patterns.

The patterned silicon wafer can be filled with metal in one of two ways. The metal, preferably copper or nickel, can be electroplated into the wafer. Alternately, a metal powder, preferably a mixture of silver and tungsten, can be hot-pressed into the wafer to form a solid electrode.

The method of the present invention can be fully automated for manufacturing purposes, and an integrated CAD/CAM (computer-aided manufacturing) system can produce finished parts directly from a three-dimensional CAD model.

DETAILED DESCRIPTION

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

The method of the present invention creates a pattern in a silicon wafer and transfers this pattern onto materials having conductive properties, for example, pure metals, alloys, or magnetic materials, to form a micropart. The pattern is transferred either directly from the silicon to the workpiece, or it is first transferred to a metal electrode, and then to the workpiece. Silicon wafers are patterned using conventional silicon micromachining techniques. Specifically, a stepped profile of a three-dimensional pattern is generated on a wafer through multiple exposure and etching operations. The limitations for the step size of the generated pattern are mainly imposed by the accuracy and uniformity of the etching process. By varying the etch time, steps of variable height can be produced in the wafer.

The patterns are then transferred to the finished part using electric-discharge machining (EDM), a metal-shaping process in which short-duration discharges are generated between a patterned electrode and a conductive workpiece. EDM is a well-known machining technique and commercial machines are widely available. Briefly, workpiece material corresponding to the electrode pattern is removed by electroerosion to produce the desired part. During the machining operation, a dielectric fluid, such as distilled water or oil, flows over the workpiece to flush away eroded particles. The electrode moves into the workpiece to a specified distance to form the part. While the process relies on short-duration discharges, longer arcs heat a wider-ranging area and may destroy the workpiece's crystalline structure. Conventional EDM machine control circuitry detects these longer-ranging arcs and raises the electrode from the surface when they are present.

Ideally, many identical parts or different parts of one assembly can be formed with one electrode, and each patterned wafer can produce many electrodes, making the process a to highly parallel and efficient one. Micro-EDM using the present invention is very well suited for mass production of microscopic and mesoscopic parts.

Adaptive Process Planning

Figure 1:
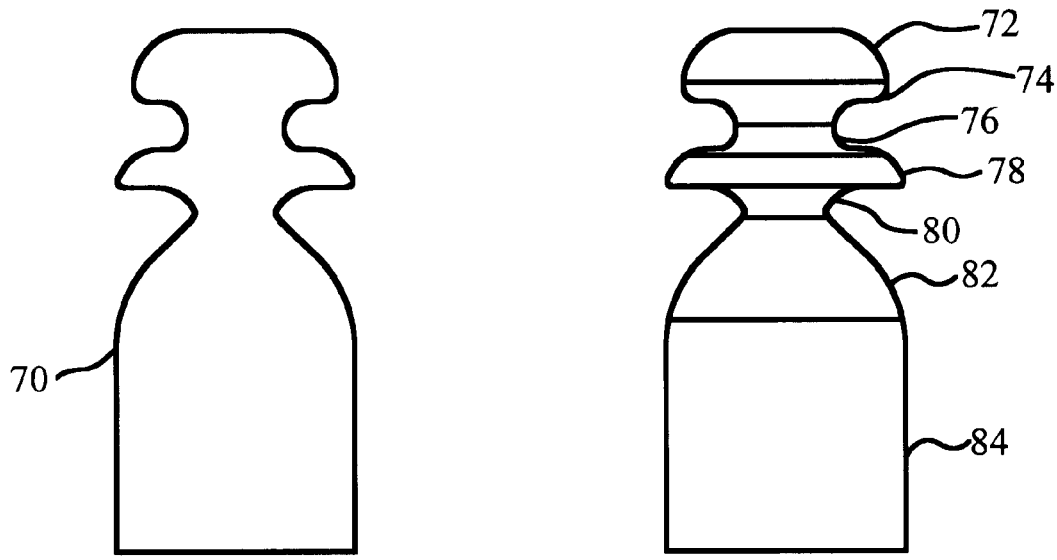
FIG. 1 is a front plan view of a micropart.

The entire process can be automated: beginning with a CAD model of the finished part, a CAD/CAM system determines the necessary wafer patterns and how to best create them. Initially, a three-dimensional computer-assisted design (CAD) model of a part or assembly to be manufactured is generated. The system breaks the part into individual subsections that can be manufactured using EDM. FIG. 1 illustrates part 70 and its division into subsections 72 through 84. When slanted or curved surfaces are encountered, the part is divided into layered steps. Smaller step sizes produce more accurate finished parts, but larger step sized parts can be manufactured more quickly. Adaptive process-planning software uses algorithms known in the art to minimize the number of steps or layers and maximize their height while satisfying accuracy specifications and part tolerances for the three-dimensional profile and its particular applications. As a first step, mathematical tools such as Fourier or Wavelet transformations are used to estimate how rapidly the part changes in a given area. The more rapidly a part changes, as for the top of part 70, the more subsections are required to represent the geometry accurately. Thus, a part having a given geometry can be divided into subsections with different thicknesses.

Techniques on which an adaptive process-planning software module may be based are disclosed in A. S. Novac et al., "Automated Technique for Adaptive Slicing in Layered Manufacturing," 7$^{th}$ International Conference on Rapid Prototyping, Mar. 31–Apr. 3, 1997, San Francisco, Calif., pp. 85–93, and in D. Dutta et al., "Improving Surface Quality and Throughput in Layered Manufacturing by Adaptive Slicing," 7$^{th}$ International Conference of Rapid Prototyping, Mar. 31–Apr. 3, 1997, San Francisco, Calif., pp. 94–101. Of course, a person skilled in the art will know how to adapt these and other planning techniques to produce optimal wafer layers from a part design.

Figure 2:
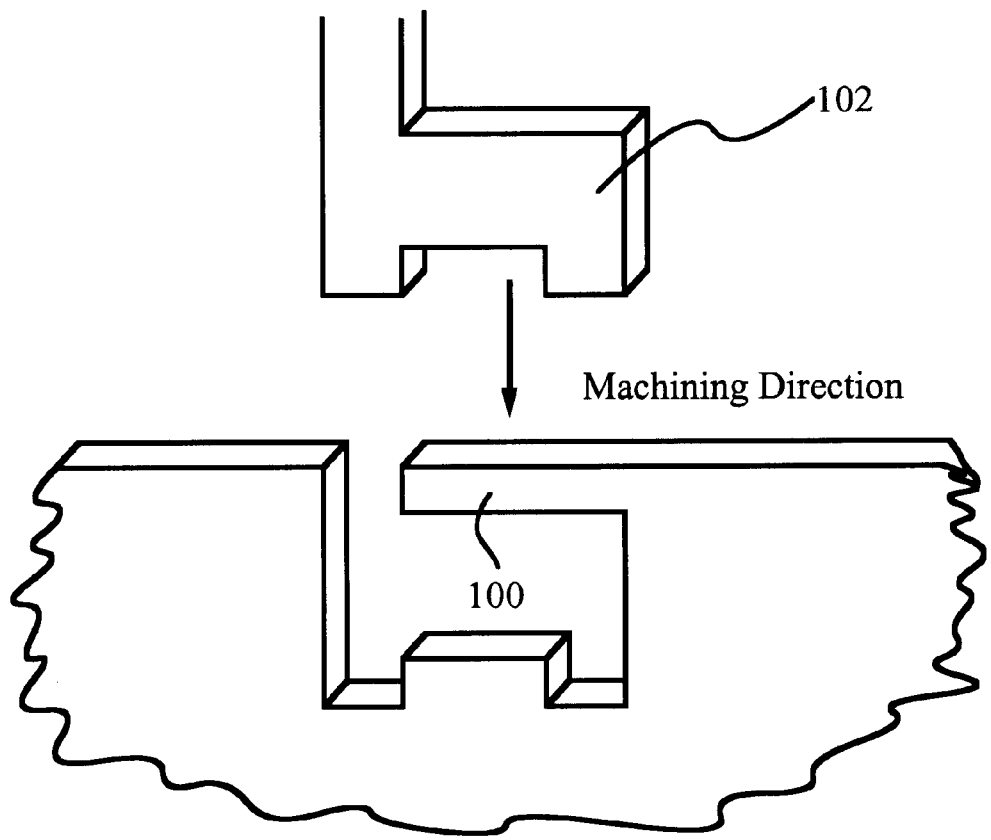
FIG. 2 is a diagram of an improperly designed EDM electrode and workpiece.
Figure 3:
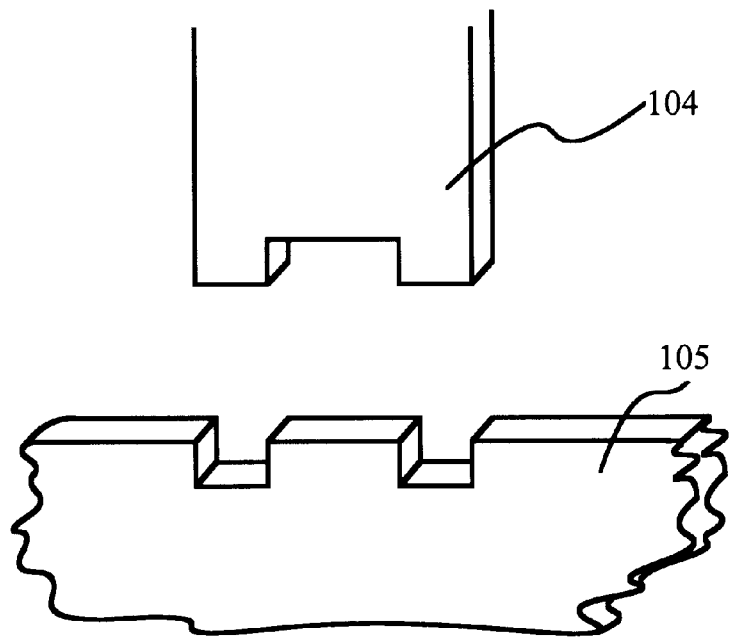
FIG. 3 is a front perspective view of an EDM electrode and workpiece.

Once the subsections are determined, the system creates the necessary electrode for each layer. The process-planning software structures the EDM process so that features such as an overhang 100, illustrated in FIG. 2, are not undercut with respect to an EDM electrode 102, i.e., not situated transversely to the machining direction. If a part with a feature such as overhang 100 is desired, the EDM electrode should not be oriented as shown in FIG. 2. FIG. 3 demonstrates clearly that EDM electrode 104 should have the inverse geometry of part 105 that is being manufactured.

Figure 4:
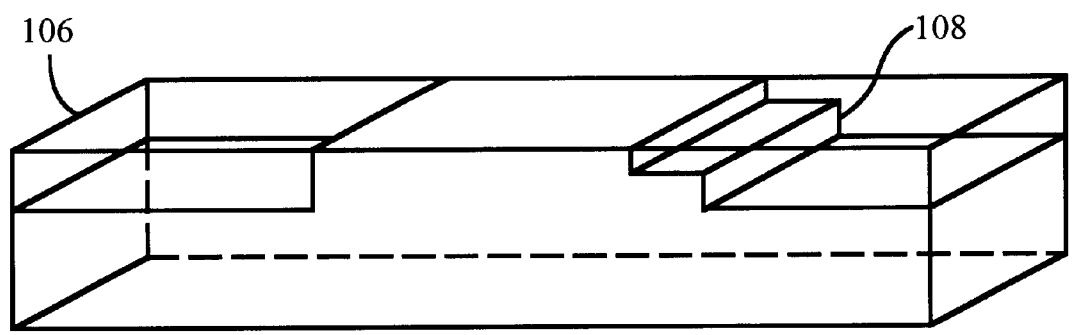
FIG. 4 is a front perspective CAD diagram of a part subtracted from a wafer.

As illustrated in FIG. 4, to produce a CAD model of a silicon electrode, the CAD/CAM system superimposes a CAD model 106 of a wafer piece, shown as a rectangular block, with a CAD model 108 of the part to be manufactured. The CAD/CAM computer automatically generates the geometry of the EDM electrode by subtracting part model 108 from wafer model 106. For metal electrodes, as will be described below, the part and the wafer have the same geometry, not inverse geometry as for silicon electrodes, and the system does not perform the subtraction step shown in FIG. 4.

Figure 5:
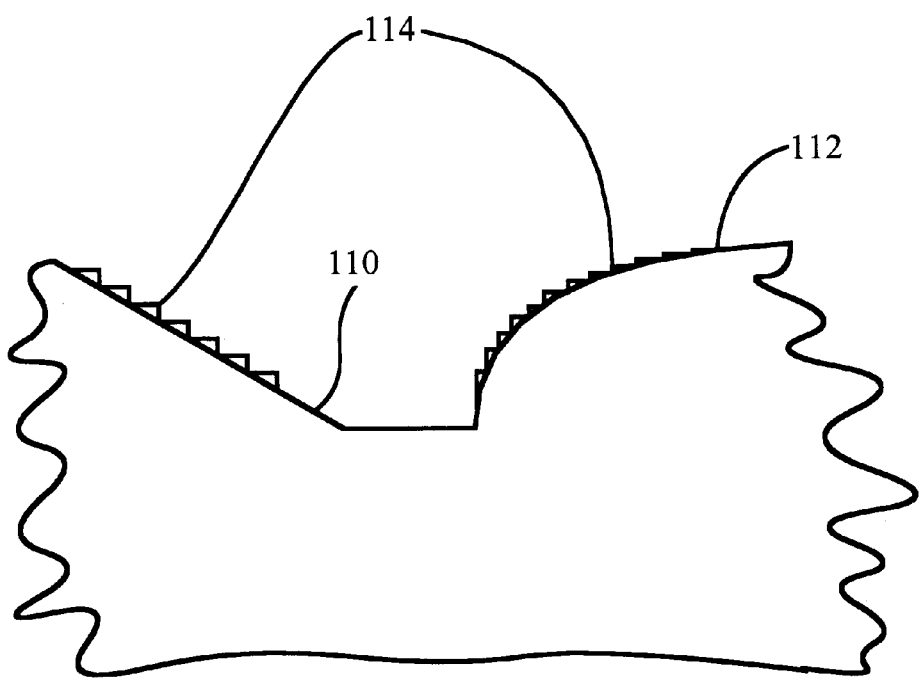
FIG. 5 is a cross-sectional view of a part with sloped and curved regions.
Figure 6:
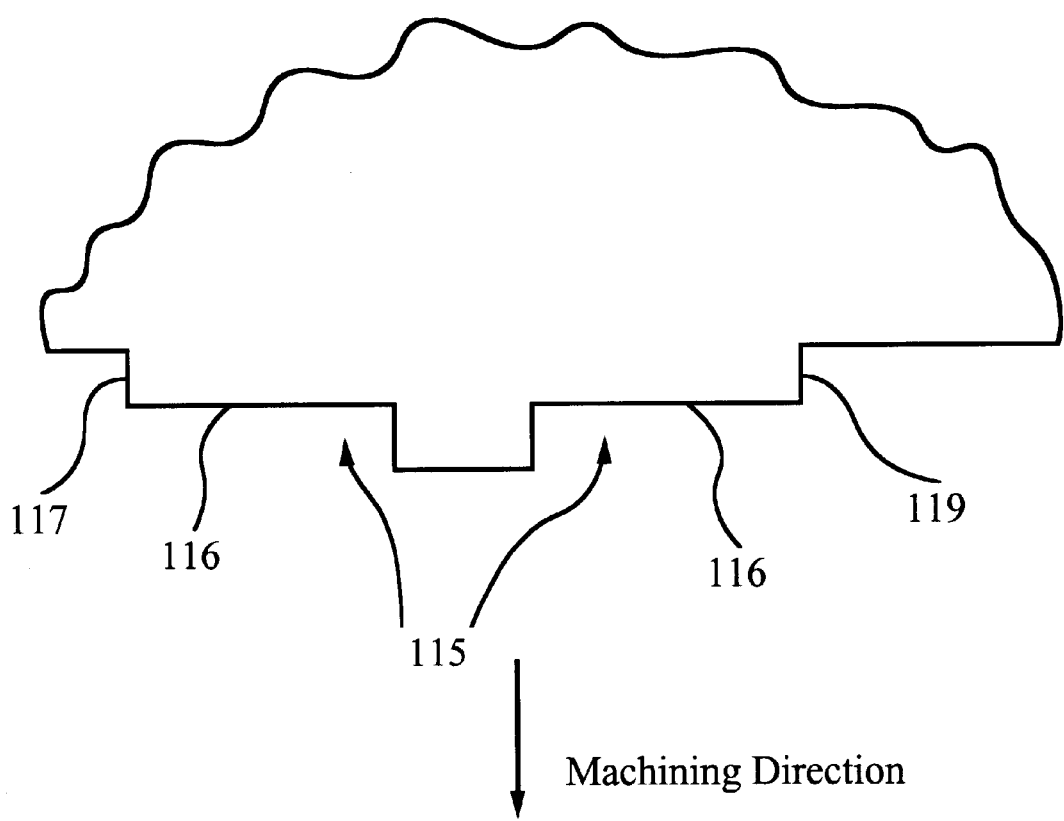
FIG. 6 is a cross-sectional view of an EDM electrode showing a prismatic section.

If, as shown in FIG. 5, the electrode contains slanted planar surfaces 110 or curved surfaces 112, the adaptive process-planning software automatically approximates such surfaces with stair steps 114. FIG. 6 illustrates a section 115 of the electrode that is prismatic in the machining direction, i.e., comprises co-planar faces 116 that are defined by sides 117 and 119, perpendicular to faces 116 and parallel to the machining direction. For every such prismatic section, a photographic mask for silicon processing must be produced. The appropriate number of such photographic masks and individual patterns thereof are automatically generated for every electrode by the adaptive process-planning software.

When generating the EDM electrode, the adaptive process-planning software is capable of automatically offsetting the electrode surface to compensate for overburn. Overburn is the excessive removal of material from the part being manufactured by the EDM process. When the rate of overburn is known, the CAD/CAM computer can be programmed to automatically offset specific electrode surfaces by an appropriate distance to compensate for excessive material removal caused by electroerosion.

Silicon Processing

After the shape of the electrode and photographic masks have been determined, a patterned silicon wafer is formed using standard silicon processing technology. Patterned silicon wafers contain features with heights between 1 $\mu$m and 1 mm. The term "feature" describes any discrete part of a pattern, such as a trough. Many methods may be used to produce an anisotropically etched wafer containing the desired pattern, and a suitable method is described below. First, a silicon wafer with the necessary thickness is chosen; the thickness of commercially available wafers ranges between 10 $\mu$m and 1 mm. Preferably, the wafer is highly doped and has a resistivity of 0.001 $\Omega$cm.

Figure 7:
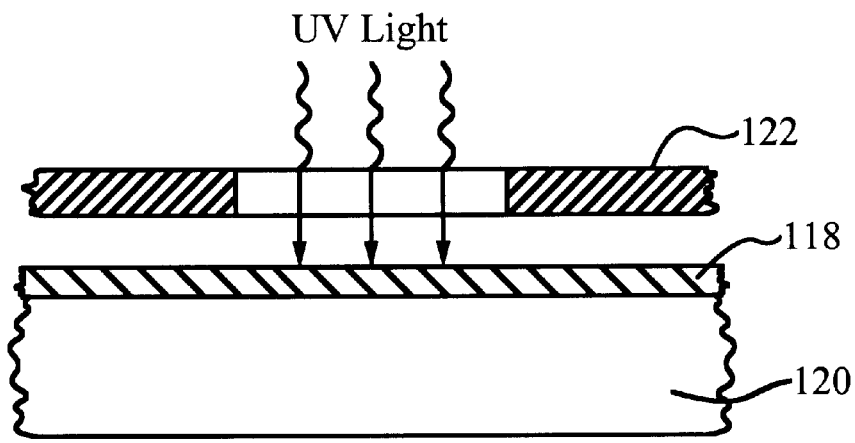
FIG. 7 is a cross-sectional view of a photoresist-coated wafer being exposed to UV light through a photographic mask.

FIG. 7 shows a wafer 120 coated with a photoresist 118. Generally, photoresist 118 is spincoated onto wafer 120: it is dispensed on the surface of wafer 120 in liquid form, and wafer 120 is spun at high velocity until photoresist 118 coats the surface of wafer 120 in a uniform, thin layer, preferably between 1 and 15 $\mu$m. Next, the photoresist is cured.

Figure 8:
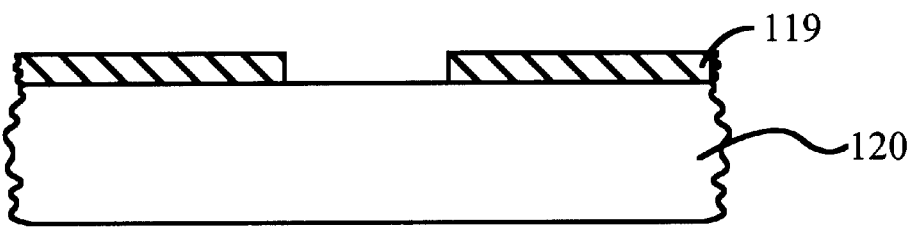
FIG. 8 is a cross-sectional view of the wafer and photoresist of FIG. 7 after developing.

Wafer 120 coated with photoresist 118 is then mounted in a commercially-available mask aligner (not shown) and exposed to UV light through a photographic mask 122. Photographic mask 122 contains the desired pattern for the layer being formed, and photoresist 118 is exposed to light only through the transparent regions of photographic mask 122. UV light changes the molecular structure of the photoresist in the exposed regions. Negative photoresist hardens after exposure and is resistant to solvents capable of dissolving unexposed photoresist. Positive photoresist breaks down when exposed to UV light and is easily removed with solvents that cannot dissolve unexposed positive photoresist; regions are chemically dissolved using a solvent known as a "developer", leaving a pattern of hardened photoresist 119 on wafer 120, shown in FIG. 8. This pattern resists subsequent wet or dry etching, whereas the exposed surface of wafer 120 does not. Photoresist 118 is a positive photoresist, but negative photoresist may also used with appropriate photographic masks.

Wafer 120 is next etched to produce a surface pattern. A reactive ion etching machine may be used to create highly anisotropic patterns in wafer 120 by means of dry etching. Alternatively, wet agents, for example, potassium hydroxide (KOH) or tetra-methyl ammonium hydroxide (TMAH), can anisotropically etch {100} silicon wafers, i.e., wafers with a particular crystalline direction. Anisotropic etching occurs in one direction only: wafers are etched vertically, but not laterally, producing very sharp features, with sidewall tapers of less than 1.5°. The resulting patterns are prismatic. Some thickness of photoresist 119 is also etched, depending on the depth of etching of wafer 120. For example, an etch depth of 70 $\mu$m in the wafer causes an etch of at least 1 $\mu$m into photoresist 119, and the thickness of photoresist 118 must be planned accordingly. Etch depths are controlled by controlling the etch time.

Figure 9:
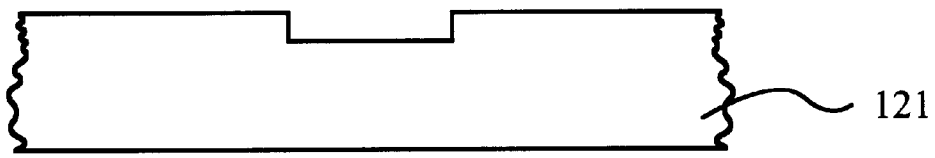
FIG. 9 is a cross-sectional view of the wafer of FIG. 8 after etching.
Figure 10:
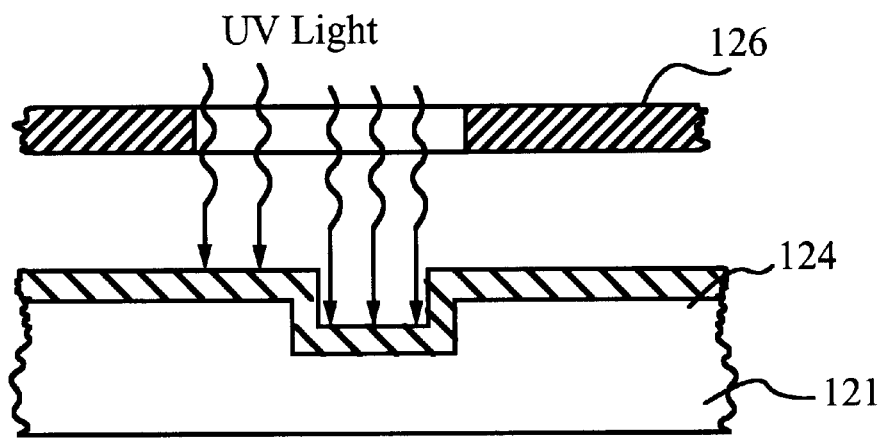
FIG. 10 is a cross-sectional view of the wafer of FIG. 9 coated with photoresist being exposed to UV light through a second photographic mask.
Figure 11:
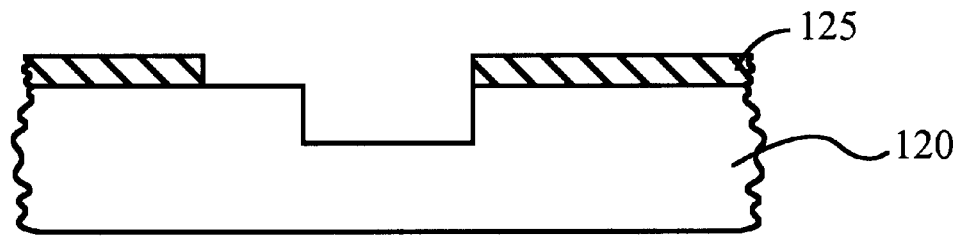
FIG. 11 is a cross-sectional view of the wafer and photoresist of FIG. 10 after developing.
Figure 12:
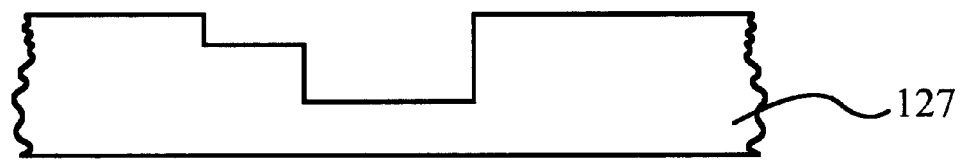
FIG. 12 is a cross-sectional view of the wafer of FIG. 11 after etching.

Photoresist 119 is removed with, for example, acetone or a four-to-one mixture of sulfuric acid and hydrogen peroxide, to reveal an etched wafer 121, shown in FIG. 9. The next prismatic section is then formed. As shown in FIG. 10, wafer 121 is coated with a new layer of photoresist 124, which is cured and exposed to UV light passing through a photographic mask 126 that contains the desired pattern for the new prismatic layer being formed. Another application of developer produces a photoresist layer 125 of FIG. 11, and subsequent etching and removal of the remaining photoresist results in a patterned wafer 127 of FIG. 12. The entire process is repeated until the desired geometry is generated in the silicon wafer.

EDM Electrodes

Electrodes produced from patterned wafer 127 are used in the EDM process, in which a controlled electric discharge is generated between the electrode and a conductive workpiece. Just as workpiece material corresponding to the electrode pattern is removed by electroerosion, electrode material is also removed during the process. Worn electrodes decrease machining precision, and must be replaced as necessary. Optimal electrode materials have the following properties:

- high electrical conductivity, to reduce the power dissipated in the electrode material, thereby reducing electrode wear;
- high thermal conductivity, to remove heat quickly from the electrode surface, reducing surface remelting and, therefore, electrode wear; and
- high melting point, to limit the amount of material that melts, reducing electrode wear.

Conventional EDM uses electrodes made of metals such as copper, graphite, silver, and steel. Electrode material for micro-EDM, while guided by the above principles, is limited by the electrode-production techniques. The present invention includes three types of electrodes, produced by three different methods. Of course, other methods for filling the patterned silicon wafer will be apparent to one skilled in the art, and these methods are, therefore, within the scope of the present invention.

Silicon EDM Electrodes

Figure 13:
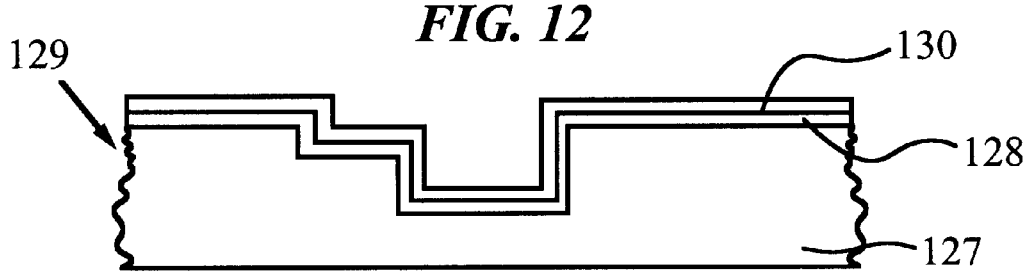
FIG. 13 is a cross-sectional view of the wafer of FIG. 12 with thin metallic layers.

Fully etched wafer 127 may first be cut into smaller pieces with, for example, a diamond wafer saw. Alternately, wafer 127 can be separated into smaller pieces after the sputtering step described below. As shown in FIG. 13, a metallic layer is deposited onto the pattern in wafer 127 to a predetermined thickness to improve the surface conductivity of the resulting electrode. The metallic layer must conform to and therefore preserve the pattern etched in wafer 127, and sputtering is a suitable technique for creating such a layer. Sputtering is a well known technique for depositing a thin layer of metal on a surface. An adhesion layer of titanium 128, preferably 0.2 $\mu$m thick, is deposited, followed by a layer of copper 130, preferably several micrometers thick. Without titanium layer 128, copper layer 130 does not adequately adhere to wafer 127. The combination of wafer piece 127 with layers 128 and 130 forms an EDM electrode 129.

Figure 14:
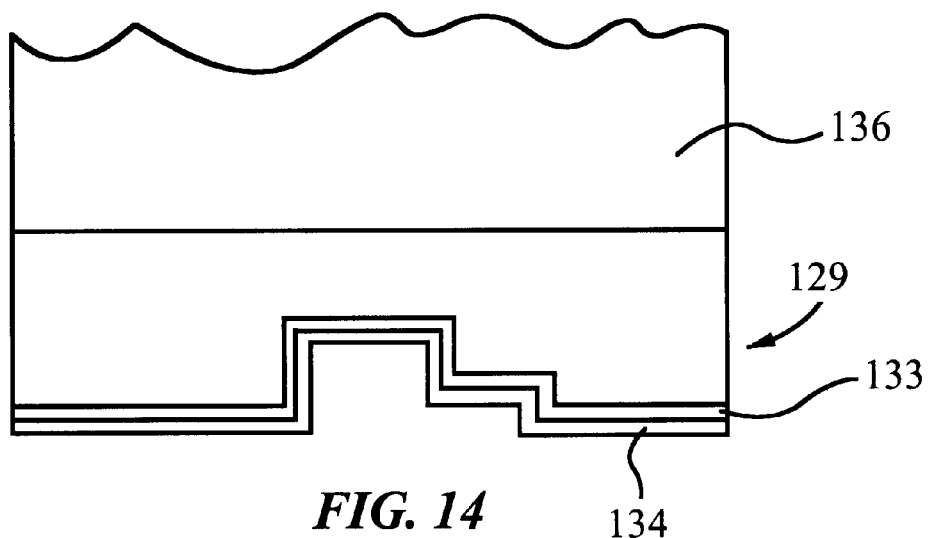
FIG. 14 is a cross-sectional view of a silicon EDM electrode attached to an electrode fixture.

As shown in FIG. 14, electrode 129 is attached to an electrode fixture 136 by, for example, electrically-conductive epoxy glue. Electrode fixture 136 may be a copper block, which fits into an electrode receptacle of an EDM machine. EDM electrodes such. as electrode 129 are called sinker electrodes because they are gradually lowered or "sunk" into the material being machined to produce the required pattern by electroerosion.

Silicon electrodes have fewer processing steps than the remaining two electrode types, which simplifies the manufacturing process. However, silicon has an electrical conductivity orders of magnitude lower than the other electrodes, and therefore wears down very rapidly.

Electroplated EDM Electrodes

Figure 15:
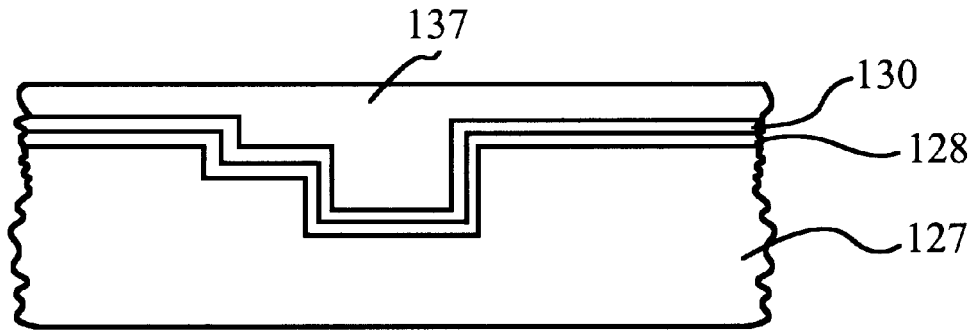
FIG. 15 is a cross-sectional view of the wafer of FIG. 13 filled with metal.

Copper is a suitable electrode material because of its high thermal conductivity and the ease with which it can be electroplated. Other materials of similar quality may also be used for the EDM electrode. In this method, fully etched wafer 127 of FIG. 12 is again cut into smaller pieces. Alternately, it can be cut after the sputtering step or even after the electroplating step, both of which are described below. As was done with the silicon electrodes, a thin metallic layer is deposited onto wafer 127, preferably by sputtering, to produce an electroplating base, as shown in FIG. 13. Titanium adhesion layer 128 is preferably 0.2 $\mu$m thick, and copper layer 130 is preferably 0.1 $\mu$m thick. Coated wafer 129 is connected to a negative electrode and immersed in an electrolyte solution for electroplating, which fills the wafer pattern with metal, in this case copper. Electroplating continues until all of the etched cavities are filled with copper 137, as shown in FIG. 15. Copper 137 must completely fill the wafer surface pattern. Electroplating is preferably done by periodic pulse reverse plating, the most efficient way of providing dense, nearly void-free copper having a smooth surface finish. Optimal current density is 30 mA/cm$^2$, which achieves a deposition rate of 25 $\mu$m/hr. The electroplating current is periodically reversed, with the reverse current being three times stronger than the forward current, but having a duration twenty times shorter. This technique is described in G. Milad, "Periodic Pulse Reverse," *Printed Circuit Fabrication*, Vol. 20, No. Jul. 7, 1997.

Figure 16:
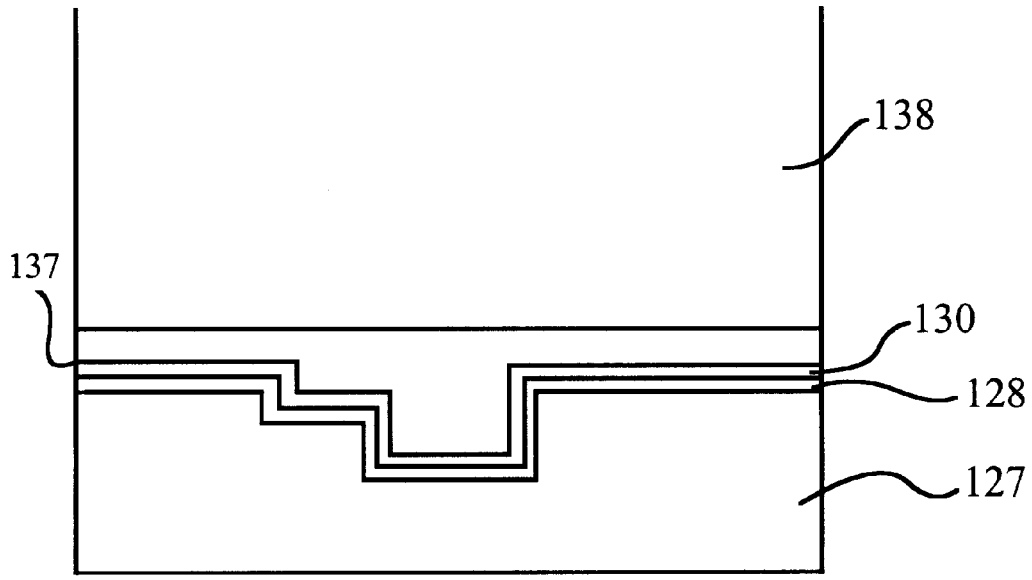
FIG. 16 is a cross-sectional view of the wafer and metal of FIG. 15 attached to an electrode fixture.
Figure 17:
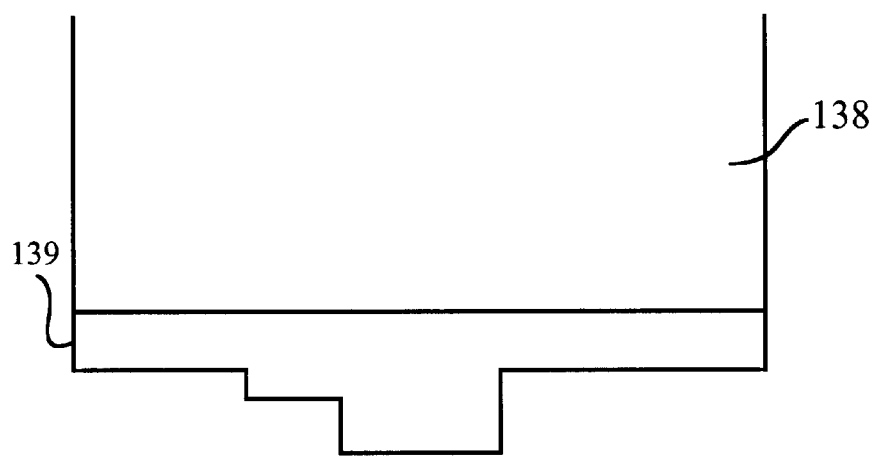
FIG. 17 is a cross-sectional view of a metal EDM electrode.

Next, as shown in FIG. 16, copper piece 137 is soldered to an electrode fixture 138, for example, a large copper block. Wafer 127 is removed by chemical etch in, for example, a potassium hydroxide bath. As illustrated in FIG. 17, the remaining copper piece 139, which includes the thin titanium layer, has a pattern that is the inverse of the pattern on silicon wafer 127. In this case, the resulting part will have the same pattern as silicon wafer 127; both of these patterns are the inverse of the pattern in copper piece 139.

Because the entire electrode is made of copper, copper electrodes formed by electroplating into silicon wafers last about twenty times as long as silicon electrodes.

Hot-Pressed EDM Electrodes

Some metals with desirable electrode properties cannot be electroplated. These high-melting temperature materials, for example, tungsten or graphite, have processing temperatures above the melting point of silicon and therefore cannot be used as electrodes in their pure form. Mixtures of metals, however, can be processed in patterned silicon wafers by hot-pressing blended powders. This allows for a combination of high melting temperature metals, for example, tungsten, with metals with high thermal conductivities, for example, silver or copper. The preferred mixture for hot-pressing EDM electrodes is a mixture of tungsten and silver particles at a weight-percent ratio of 1:2. Preferably, particle diameters are between 1 and 5 $\mu$m.

The diagram of FIG. 15 also illustrates the hot pressing process. Again, an adhesion layer of titanium 128 is first deposited on wafer piece 127, preferably by sputtering to about 0.3 $\mu$m. Next, a thin layer 130, preferably of tungsten, is deposited onto titanium layer 128. Tungsten layer 130 acts as a diffusion barrier to prevent the metal, especially silver, from penetrating into the bulk silicon. The surface pattern is then filled with the metal particle mixture and hot pressed. Hot pressing can be done in a conventional 10 ton hot press in a graphite die. Preferably, the metal is pressed at 750° C. at 30 MPa for one hour. Silicon plastic deformation does not occur under these conditions. As with the electroplated electrode, the hot-pressed electrode is attached to an electrode fixture, and the wafer is then etched away.

Hot-pressed electrodes also have a pattern that is the inverse of the silicon wafer pattern, and the wafer is processed to have the same pattern as the desired part.

EDM Workpiece Materials

Any conductive material can be used as a workpiece material. EDM preserves the crystalline structure of the workpiece material and, therefore, its macroscopic properties. Preferably, the workpiece is supplied as a thin sheet, between 25 and 100 $\mu$m thick. The material can be a crystalline or amorphous metal, i.e., a metal with an atomic or molecular structure without a regular, patterned, crystal-like arrangement. These include magnetic materials such as amorphous iron and cobalt alloys having a high saturation flux density, low coercivity, and low electrical conductivity. EDM workpieces can also be hard magnetic materials, such as SmCo, NdFeB, or FeCrCo. For example, a micromotor requires a magnetic rotor, which can be made by EDM. Magnetic materials can be magnetized either before or after the part is formed by EDM. If the material is magnetized before EDM, particles of removed workpiece are attracted to the bulk workpiece and must be removed by brushes or fluid during machining. Preferably, the part is magnetized after fabrication.

Figure 18A:
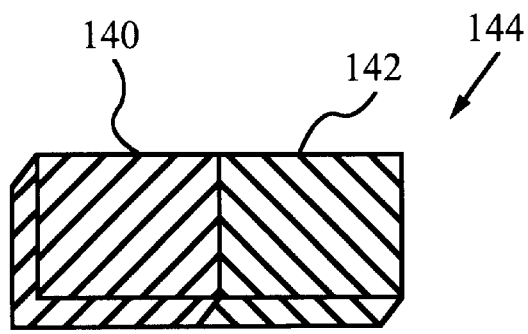
FIG. 18A is a front perspective view of a magnetic material.
Figure 18B:
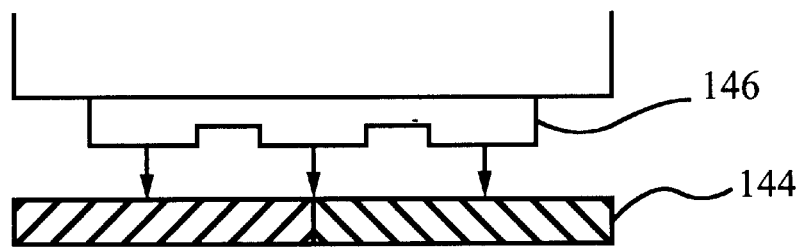
FIG. 18B is a cross-sectional view of electric-is charge machining of the material of FIG. 18A.
Figure 18C:
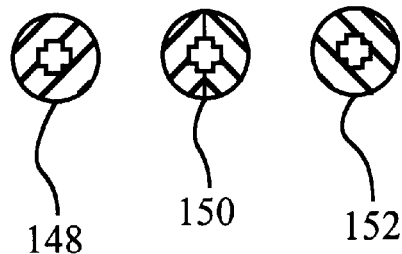
FIG. 18C is a top plan view of microparts produced by the method of FIG. 18B.

Parts with regions of different magnetic orientations can be made by EDM. FIG. 18A shows a workpiece 144 formed by joining two different magnetic materials 140 and 142 together by an adhesive before machining. As shown in FIG. 18B, an EDM electrode 146 sinks over workpiece 144 to create the three different parts 148, 150, and 152 shown in FIG. 18C. Part 150 was formed at the boundary between materials of two different magnetic orientations. Clearly, this type of part cannot be formed by other standard micromachining techniques.

After part production, an optical microscope may be used to detect undesirable heat patterns in the workpiece material, i.e., spots where the metal was overheated due to arcing during electric-discharge machining. Instead of evaporation of a small amount of workpiece material, which occurs in the immediate vicinity of a normal discharge pulse having a short duration, workpiece material is melted by a long-lasting arc in a much larger area surrounding the arc. Such melting also destroys the crystalline structure of the material and, therefore, its macroscopic properties such as strength, hardness, and magnetic properties. A standard magnetic sensor can also be used to verify whether the finished parts possess the required magnetic properties, including coercivity, permeability, and saturation flux density.

EDM Circuitry

EDM electrodes produced by the method of the present invention can be used in conventional or micro-EDM machines, provided that the current can be adjusted as needed. The allowed current through the EDM micro-electrode is limited by the surface roughness requirements of the parts. For microparts, the desired surface roughness is a few micrometers. To achieve this value, the maximum duration of electrical discharge is on the order of several microseconds, and the current during discharge is generally smaller than one ampere.

Commercially-available micro-EDM machines are capable of producing the appropriate surface finish, but they are more expensive than conventional EDM machines. Micro-EDM machines require positioning stages accurate to about 1 $\mu$m, because the part is moved during machining to "cut" the pattern into the workpiece material. In contrast, conventional EDM machines require only repeatable vertical movement.

Conventional EDM machines are used to shape large parts such as injection molds. For these applications, several millimeters of material have to be removed in a relatively short time of a few hours and the acceptable surface roughness can be tens of micrometers. The current during the electrical-discharge cycle of a conventional EDM machine reaches several amperes and the discharge period can be on the order of milliseconds. A controller regulates the machining parameters. While conventional EDM machines, fitted with micro-electrodes, are capable of producing short-duration electrical discharges required for generation of micron-scale patterns, they cannot produce discharge currents small enough to provide smooth surface finishes desired for microscopic patterns.

Figure 19:
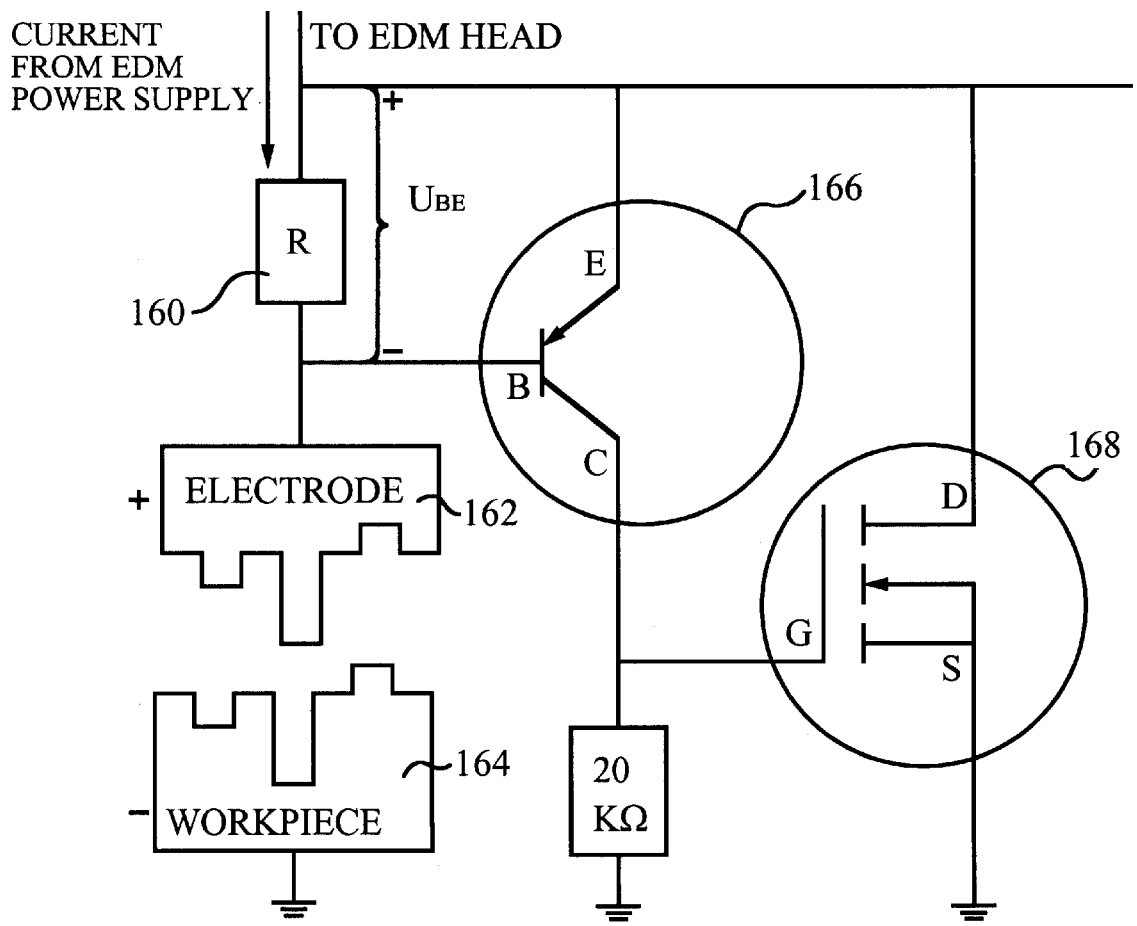
FIG. 19 is a circuit diagram of a control circuit used for micro-EDM.
Figure 20:
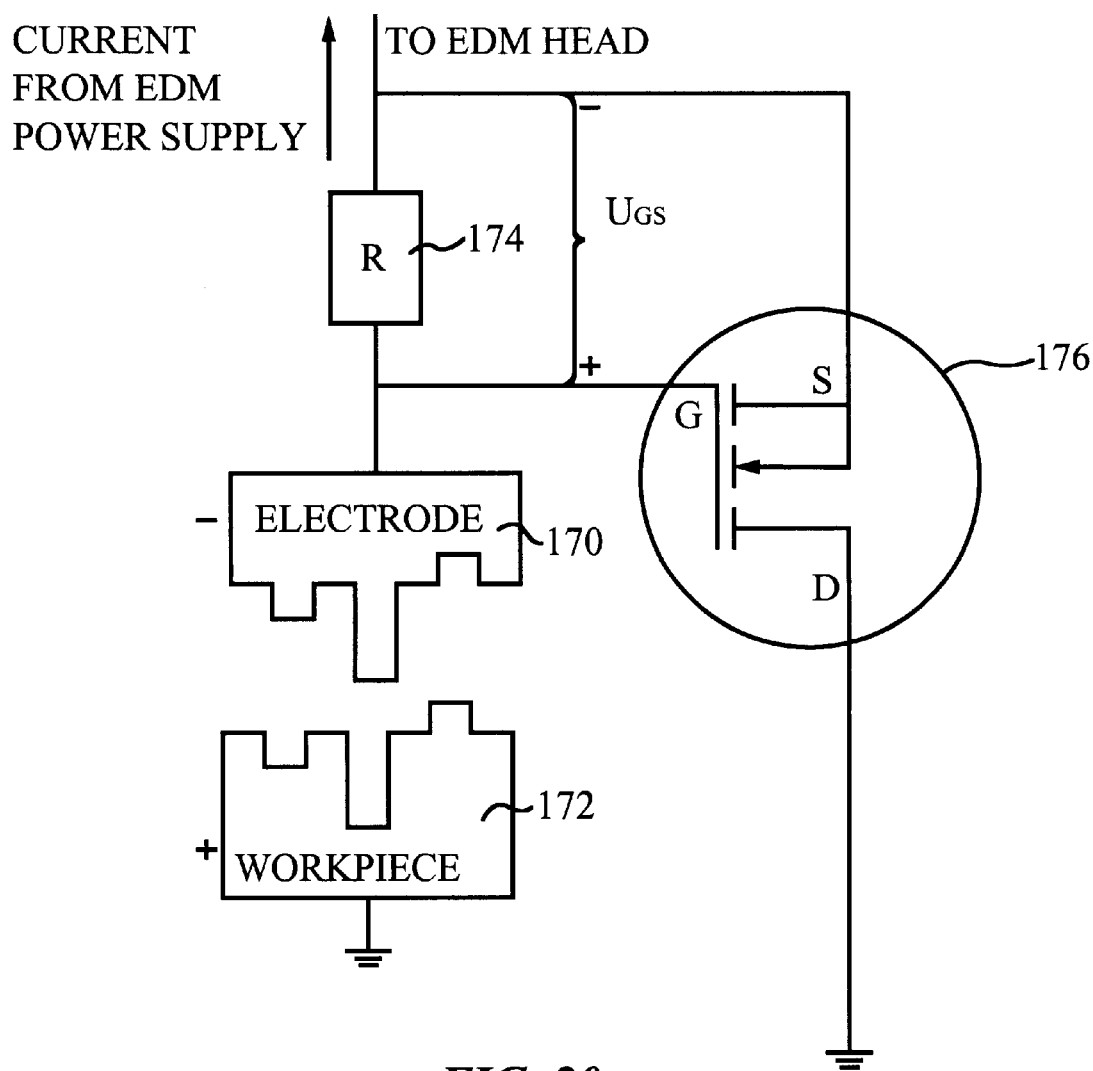
FIG. 20 is a circuit diagram of an alternate control circuit used for micro-EDM.

An EDM machine incorporating electrodes produced by the method of the current invention includes a control circuit that reduces the current through the EDM electrode to the levels required for micro electric-discharge machining. One embodiment of the control circuit, shown in FIG. 19, is used when the EDM electrode is the anode (positive pole) during discharge. An alternative embodiment of the control circuit, illustrated in FIG. 20, is appropriate when the electrode is the cathode (negative pole). Of course, other circuits are capable of reducing the current through the EDM electrode, and are within the scope of the present invention.

For the circuit of FIG. 19, the electrode current during discharge is limited to approximately $U_{BE}/R$. For the circuit of FIG. 20, the current is limited to approximately $U_{GS}/R$. $U_{BE}$ is about 0.7 volts for bipolar-junction transistors, whereas $U_{GS}$ is between 2 and 3 volts for common MOSFET transistors. As long as bipolar junction transistor 166 and MOSFET transistor 168 remain non-conductive, all the current produced by the EDM power supply during a discharge cycle flows through the leg of the circuit containing EDM electrode 162 and workpiece 164. If the current through resistor 160 increases to a level where $U_{BE}$ exceeds 0.7 volts, transistors 166 and 168 become conductive, causing most of the current to bypass the electrode 162 during discharge.

FIG. 20 illustrates a circuit where electrode 170 serves as the cathode or negative pole. As long as the current flowing through resistor 174 during a discharge cycle is such that the voltage drop $U_{GS}$ across the resistor is below approximately three volts, MOSFET transistor 176 remains non-conductive and all of the current produced by the EDM power supply flows through the circuit leg containing electrode 170 and workpiece 172. As the limiting value of $U_{GS}$ is exceeded, transistor 176 becomes conductive, bypassing current from the electrode during discharge.

Integrated Manufacturing Setup

Figure 21:
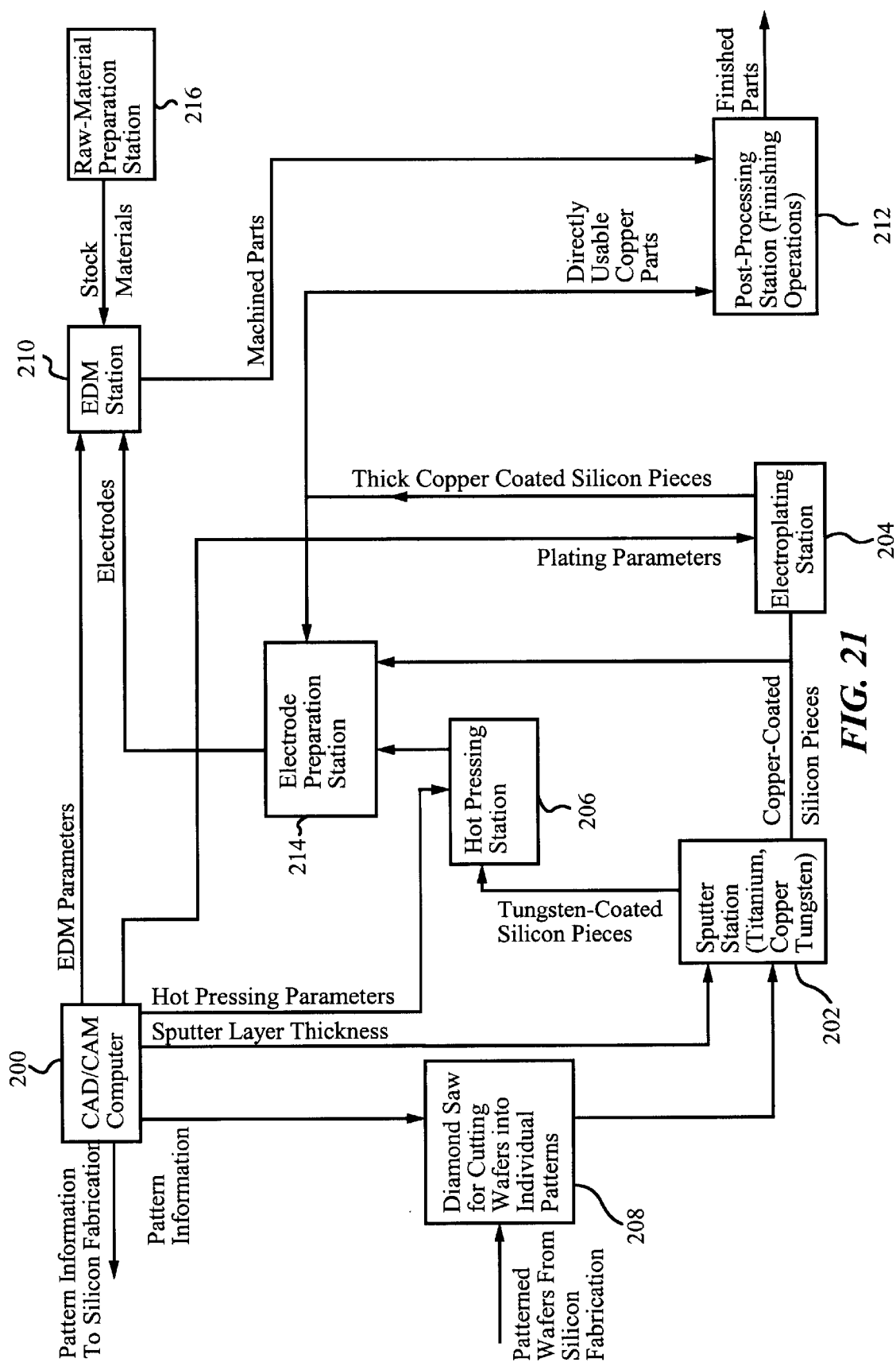
FIG. 21 is a block diagram of an integrated manufacturing setup for microfabrication using EDM.

FIG. 21 is a block diagram of an integrated system for manufacturing micron-sized parts. This example is intended to illustrate, but not limit, the incorporation of the present method into an automated manufacturing system. The system of FIG. 21 does not include the silicon fabrication facility because silicon processing must be performed in dedicated clean rooms, which are expensive to operate and allow much higher throughput than the other stations. The silicon-processing operations can be outsourced or performed in a separate area of the plant, depending on the throughput Several integrated systems can be operated in parallel, receiving patterned wafers from one centralized silicon plant.

The system is controlled by a central computer 200, which stores CAD files, executes process planning, and controls the individual stations. For example, the computer provides data such as the sputter-layer thickness to a sputter station 202, supplies plating parameters to an electroplating station 204 and pressing parameters to a hot-pressing station 206, controls a diamond saw 208 by supplying the necessary pattern information required for slicing silicon pieces into individual patterns, and furnishes machining parameters to an EDM station 210. The computer also helps maximize machine utilization and part throughput by scheduling individual jobs so that several batches of parts can be processed at the same time.

After wafers delivered from the silicon plant have been sliced by diamond saw 208, they are coated with titanium and copper or titanium and tungsten at sputtering station 202. If a silver-tungsten electrode is required, the silicon pieces are directed to hot-pressing station 206. If a copper electrode is required, the silicon pieces are directed to electroplating station 204. If copper is the material from which a part is to be manufactured, the electroplated part does not have to go through the EDM process and can be forwarded directly to a post-processing station 212. Otherwise, the silicon, copper, or silver-tungsten part is taken to an electrode-preparation station 214 to be mounted onto an electrode fixture, after which it is used as an electrode at computer-controlled EDM station 210 to pattern conductive material, delivered to the EDM station from a raw-material preparation station 216. At raw-material preparation station 216, steps such as heat treating may be performed on the bulk material to provide it with a crystalline structure appropriate for the desired application. The finishing steps performed at post-processing station 212 are highly dependent on the individual application.

It will be clear to one skilled in the art that the above embodiment may be altered in many ways without departing from the scope of the invention. Accordingly, the scope of the invention should be determined by the following claims and their legal equivalents.

What is claimed is:

1. A method of fabricating a microstructure from a conductive workpiece, said method comprising the steps of:
   a) etching a silicon wafer to produce a surface pattern in said wafer;
   b) depositing a metallic layer to a predetermined thickness on said surface pattern, wherein said metallic layer conforms to said surface pattern; and
   c) generating an electric discharge between said metallic layer and said workpiece to remove workpiece material corresponding to said surface pattern, wherein said remaining workpiece comprises said microstructure.

2. The method of claim 1, wherein said metallic layer is deposited by sputtering.

3. The method of claim 1, wherein said surface pattern comprises features having heights of between 1 $\mu$m and 1 mm.

4. The method of claim 1 wherein said workpiece comprises an amorphous metal.

5. The method of claim 1 wherein said workpiece comprises a crystalline metal.

6. The method of claim 1 wherein said workpiece comprises a magnetic material.

7. The method of claim 6 wherein said magnetic material comprises regions of different magnetic orientations.

8. A method of fabricating a microstructure from a conductive workpiece, said method comprising the steps of:
   a) etching a silicon wafer to produce a surface pattern in said wafer;
   b) filling said surface pattern with a metal to create an inverse surface pattern in said metal;
   c) removing said silicon wafer from said metal; and
   d) generating an electric discharge between said metal and said workpiece to remove workpiece material corresponding to said inverse surface pattern, wherein said remaining workpiece comprises said microstructure.

9. The method of claim 8 wherein step (b) comprises electroplating.

10. The method of claim 9 wherein said metal is chosen from the group consisting of copper and nickel.

11. The method of claim 8 wherein step (b) comprises hot-pressing a metal powder.

12. The method of claim 11 wherein said metal powder comprises a mixture of silver and tungsten.

13. The method of claim 8 wherein said surface pattern comprises features having heights of between 1 $\mu$m and 1 mm.

14. The method of claim 8 wherein said workpiece comprises an amorphous metal.

15. The method of claim 8 wherein said workpiece comprises a crystalline metal.

16. The method of claim 8 wherein said workpiece comprises a magnetic material.

17. The method of claim 16 wherein said magnetic material comprises regions of different magnetic orientations.

* * * * *